(12) United States Patent
Schelling

(10) Patent No.: US 12,715,761 B2
(45) Date of Patent: Aug. 25, 2026

(54) MICROELECTROMECHANICAL ACOUSTIC COMPONENT

(71) Applicant: Robert Bosch GmbH, Stuttgart (DE)

(72) Inventor: Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 178 days.

(21) Appl. No.: 18/615,358

(22) Filed: Mar. 25, 2024

(65) Prior Publication Data

US 2024/0343552 A1 Oct. 17, 2024

(30) Foreign Application Priority Data

Apr. 17, 2023 (DE) ..................... 10 2023 203 446.8

(51) Int. Cl.
*B81B 3/00* (2006.01)
*H04R 7/06* (2006.01)
*H04R 19/04* (2006.01)

(52) U.S. Cl.
CPC ............. *B81B 3/0021* (2013.01); *H04R 7/06* (2013.01); *H04R 19/04* (2013.01); *B81B 2201/0257* (2013.01); *B81B 2201/0264* (2013.01); *B81B 2203/0127* (2013.01); *B81B 2203/04* (2013.01); *H04R 2201/003* (2013.01)

(58) Field of Classification Search
CPC .. H04R 2201/003; H04R 7/24; H04R 19/005; B81B 2203/04; B81B 2201/0264; B81B 2201/0257; B81B 3/0021
See application file for complete search history.

(56) References Cited

U.S. PATENT DOCUMENTS

2015/0001647 A1* 1/2015 Dehe ..................... B81B 3/0078 257/416
2019/0306633 A1* 10/2019 Yang ........................ H04R 7/06
2019/0352176 A1 11/2019 Doller et al.

FOREIGN PATENT DOCUMENTS

DE 102009000053 A1 7/2010
DE 102014212340 A1 1/2015
DE 102015210919 A1 12/2016
DE 102017118857 B3 10/2018
EP 4270992 A1 * 11/2023 ............... H04R 7/08

* cited by examiner

*Primary Examiner* — Sunita Joshi
(74) *Attorney, Agent, or Firm* — NORTON ROSE FULBRIGHT US LLP

(57) ABSTRACT

A microelectromechanical component for interacting with a pressure gradient of a fluid. The component has a substrate with a through-cavity, a microelectromechanical transducer including a middle support layer and two diaphragm elements spaced apart from the middle support layer. The middle support layer has at least one center electrode. The diaphragm elements each have a separately contactable outer electrode. The diaphragm elements together with the middle support layer form one or more cavities on both sides of the middle support layer. The microelectromechanical transducer spans the through-cavity at least partially and is deformable along a vertical movement direction. The microelectromechanical transducer has a bending region. A deformation of the microelectromechanical transducer in the vertical movement direction results in a bending of the bending region. Spacers are arranged between the middle support layer and the diaphragm elements. At least one of the spacers is arranged in the bending region.

10 Claims, 6 Drawing Sheets

100
101
102
103
104
110
111
112
113
120
121
122
123
124
125
126
127
128
129
130, 131
130, 132
133

100
101
102
103
110
120
121
122
123
124
125
126
127
128
130, 131
130, 132
133
134
135
136
137
138
139
141

100
101
102
103
120
110
133
128
141
149
111
125
130
147
126
143
123
121
144
148
134
146
124
122
127

100
101
102
134
120
144
130
146
147
144
120
141
130
144
120
141
130
130
144
120

160
determine capacitance between center and respective outer electrodes
apply electrical bias voltage between center and outer electrodes
convert detected capacitance signal into audio signal
163
161
162

MICROELECTROMECHANICAL ACOUSTIC COMPONENT

CROSS REFERENCE

The present application claims the benefit under 35 U.S.C. § 119 of German Patent Application No. DE 10 2023 203 446.8 filed on Apr. 17, 2023, which is expressly incorporated here by reference in its entirety.

FIELD

The present invention relates to a microelectromechanical acoustic component and to a method for operating a microelectromechanical acoustic component.

BACKGROUND INFORMATION

Microphones which are designed as a capacitively readable microelectromechanical system (MEMS) are particularly powerful with regard to signal-to-noise ratio, energy consumption, and further processability. This has resulted in electret microphones being largely replaced by MEMS microphones. A development which has led to a significant increase in the signal-to-noise ratio is MEMS microphones with a double diaphragm. In this concept, the fluidic damping between the rigid back electrode (backplate) and the movable back-pressure diaphragm is almost completely eliminated. This is achieved in that the back electrode is mounted in a negative-pressure region between two diaphragms coupled to one another. However, such microphones still suffer from the non-linearity of the signal, which non-linearity results from the capacitive operating principle. MEMS microphones are described in German Patent Application Nos. DE 10 2014 212 340 A1 and DE 10 2015 210 919 A1. These patent applications describe MEMS transducers for the interaction with fluid flows.

SUMMARY

An object of the present invention is to provide an improved microelectromechanical acoustic component. A further object of the present invention is to provide an operating method for such a microelectromechanical acoustic component. These objects may be achieved by features of the present invention. Advantageous embodiments and developments of the present invention are disclosed herein.

The present invention relates to a microelectromechanical component, in particular a relative pressure sensor or a microelectromechanical acoustic component, in particular a microelectromechanical microphone, for interacting with a pressure gradient of a fluid. The fluid can in particular be air. According to an example embodiment of the present invention, the microelectromechanical component has a substrate with a through-cavity, at least one microelectromechanical transducer consisting of a middle support layer and two diaphragm elements spaced apart from the middle support layer. The middle support layer has at least one center electrode. The diaphragm elements each have a separately contactable outer electrode. The diaphragm elements together with the middle support layer form one or more cavities on both sides of the middle support layer at least in regions. The microelectromechanical transducer spans the through-cavity at least partially and is deformable along a vertical movement direction. The microelectromechanical transducer has a bending region. A deformation of the microelectromechanical transducer in the vertical movement direction results in a bending of the bending region. Spacers are arranged between the middle support layer and the diaphragm elements. At least one of the spacers is arranged in the bending region. The spacers can be linear or flat spacers.

In particular, the microelectromechanical transducer can also have more than one bending region. One of the spacers can be arranged in each of these bending regions.

A bending of the bending region results in a change in a capacitance between the center electrode and the outer electrodes. In particular, the center electrode and in each case one of the outer electrodes can be regarded as a capacitance. When the bending region is bent, a distance between the center electrode and the outer electrodes changes so that the capacitance changes. This change in capacitance can be read. A bending of the bending region can in particular take place by a sound impinging on the microelectromechanical component. In this case, the microelectromechanical component acts as a microphone.

According to an example embodiment of the present invention, it can be provided that the spacers are fixedly connected to the center electrode or the outer electrodes. In particular, the center electrode or the outer electrodes are not movable relative to the spacers. This in particular also ensures that the center electrode likewise bends in the bending region, and a signal evaluation is thus simplified since a change in capacitance in the bending region is greater than a change in capacitance in the conventional components, in which the outer electrodes can move relative to the center electrode. A distance of the center electrode from the outer electrodes of a few 100 nm can be adjusted via the spacers.

According to an example embodiment of the present invention, the cavity or cavities can have a fluidic connection to the outside. In particular, it can be provided that a connection to the outside is provided for at least one cavity, a plurality of cavities, or for all cavities. The connection can extend both via through-openings in the outer electrodes and via through-openings in the spacers and the outer electrodes or the substrate.

Such a microelectromechanical component can be produced with the conventional methods for microelectromechanical systems.

In an example embodiment of the present invention, the microelectromechanical component has a plurality of microelectromechanical transducers, each consisting of a middle support layer and two diaphragm elements spaced apart from the middle support layer. The middle support layer has at least one center electrode. The diaphragm elements of each microelectromechanical transducer each have a separately contactable outer electrode. The diaphragm elements together with the middle support layer form one or more cavities on both sides of the middle support layer at least in regions. The microelectromechanical transducers span the through-cavity at least partially and are deformable along a vertical movement direction. The microelectromechanical transducers each have a bending region. A deformation of the microelectromechanical transducers in the vertical movement direction in each case results in a bending of the bending region of the relevant microelectromechanical transducer. Spacers are arranged between the middle support layer and the diaphragm elements. At least one of the spacers is arranged in each bending region. A number of the microelectromechanical transducers may be two, three, or four. However, even more microelectromechanical transducers may also be provided. Further embodiments of the microelectromechanical transducer are described below. The corresponding configurations may also be provided in more than one of the microelectromechanical transducers.

In an example embodiment of the microelectromechanical component of the present invention, the bending region of the microelectromechanical transducer is arranged in regions of greatest curvature of the microelectromechanical transducer. A bending region of the microelectromechanical transducer may, for example, be arranged centrally and/or in a suspension region of the middle support layer.

In an example embodiment of the microelectromechanical component of the present invention, the microelectromechanical transducer has at least one fluidic connection opening. A connection between a front side of the microelectromechanical transducer and a rear side of the microelectromechanical transducer is provided by means of the fluidic connection opening. The fluidic connection opening can in particular be used for a pressure compensation between the front side of the microelectromechanical transducer and the rear side of the microelectromechanical transducer and thus, for example, can help to prevent or at least reduce damage to the microelectromechanical transducer in the case of an overpressure on either the front side of the microelectromechanical transducer or the rear side of the microelectromechanical transducer. Alternatively, in the case of a microphone, the fluidic connection opening can be used to limit an undesired sensitivity to low pressure change frequencies in a targeted manner.

In an example embodiment of the microelectromechanical component of the present invention, the cavity has or the cavities have a negative pressure, in particular a vacuum. In this case, a connection opening can be provided in the middle support layer and/or the center electrode in order to fluidically connect cavities on both sides to one another. Due to a differential pressure between the cavity and the surroundings, diaphragm elements can be deflected to such an extent that the diaphragm elements rest mechanically between two adjacent spacers on the middle support layer. This can increase a sensitivity. The diaphragm elements can be part of the outer electrode. In particular, it can be provided here that the diaphragm element and/or the middle support layer have an insulation layer in order to prevent a short-circuit in the case of mechanical contact.

In an example embodiment of the microelectromechanical component of the present invention, the spacers between the diaphragm elements and the middle support layer are designed to be wall-shaped and/or column-shaped. This makes simple production of the spacers with the conventional methods for microelectromechanical systems possible.

In an example embodiment of the microelectromechanical component of the present invention, the spacers are arranged offset to one another on both sides of the middle support layer.

In an example embodiment of the present invention, the microelectromechanical component furthermore comprises an electronic circuit. The electronic circuit is configured to apply an electrical bias voltage between the center electrode and the outer electrodes. The bias voltage can in particular be used to adjust a bending of the electromechanical transducer and thus to increase a sensitivity. The electronic circuit can be part of the substrate so that an integrated circuit is present. Furthermore, the electronic circuit can be accommodated in a component of the microelectromechanical component.

The present invention also relates to a method for operating such a microelectromechanical component. In this method, a capacitance of the center electrode and the respective outer electrodes is determined in order to detect a bending of the bending region and thus a deformation of the microelectromechanical transducer in the vertical movement direction. In particular, a capacitance between the center electrode and one of the outer electrodes and also a further capacitance between the center electrode and the other outer electrode can be detected. The detected capacitance signal can, for example, be converted into an audio signal so that the microelectromechanical component operates as a microphone.

In an example embodiment of the method of the present invention, an electrical bias voltage is also applied between the center electrode and the outer electrodes. The bias voltage can in particular be used to adjust a bending of the electromechanical transducer and thus to increase a sensitivity.

Exemplary embodiments of the present invention are explained with reference to the figures.

DETAILED DESCRIPTION OF EXAMPLE EMBODIMENTS

In the description of the drawings, identical or identically acting elements are provided with identical reference signs. Each element provided with a reference sign is not necessarily described in detail for each figure. In particular, the corresponding features can also apply to the respective other figures and optionally also be provided there.

Figure 1:
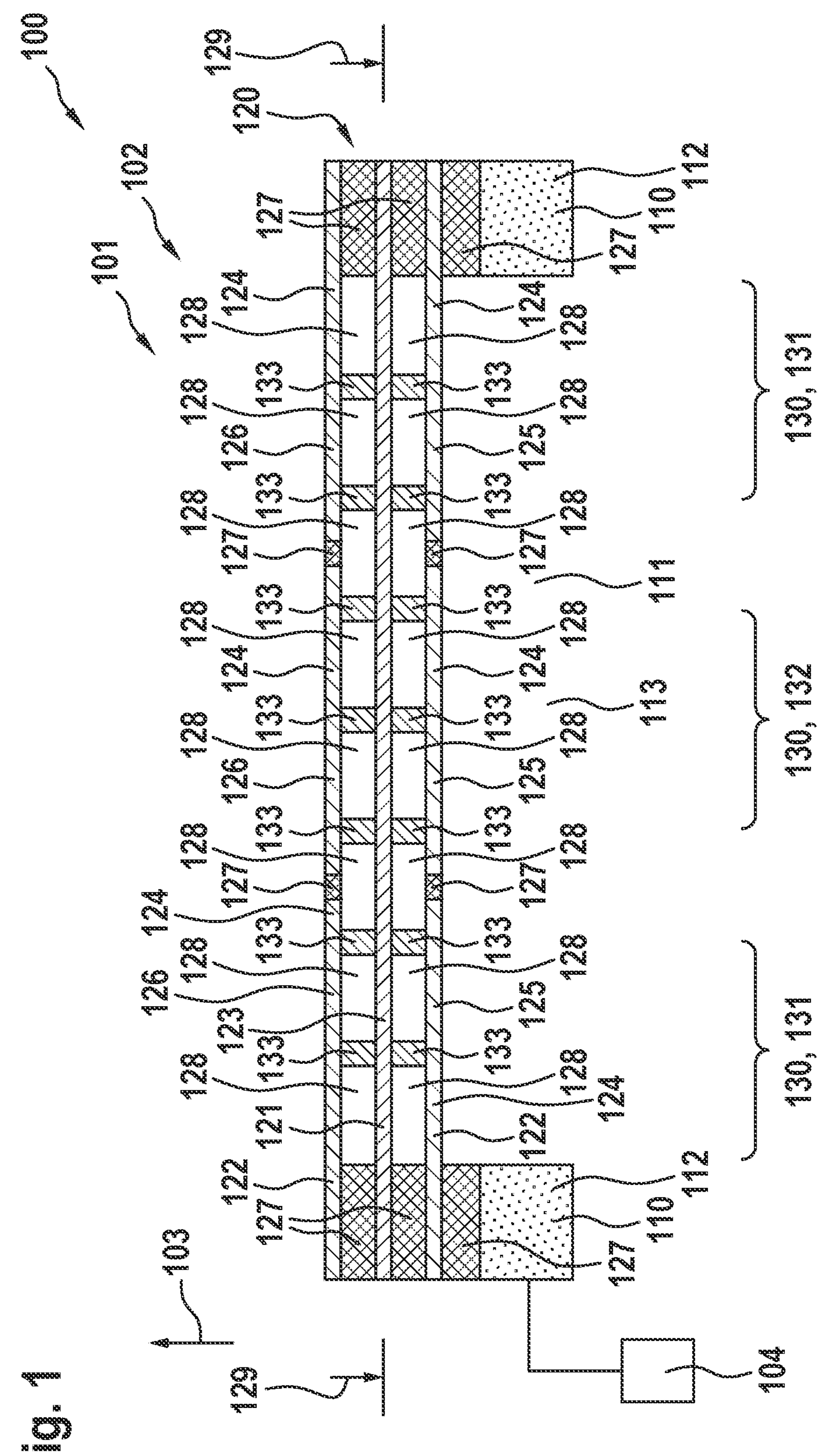
FIG. 1 is a cross-section of a microelectromechanical component according to an example embodiment of the present invention.

FIG. 1 is a cross-section of a microelectromechanical component 100, in particular a microelectromechanical acoustic component 101, in particular a microelectromechanical microphone 102, for interacting with a pressure gradient of a fluid. A pressure compensation hole (not shown in FIG. 1) can also be provided for a microphone 102. The fluid can in particular be air. The microelectromechanical component 100 comprises a substrate 110 having a through-cavity 111, at least one microelectromechanical transducer 120 consisting of a middle support layer 121 and two diaphragm elements 122 spaced apart from the middle support layer 121. The middle support layer 121 has at least one center electrode 123. The diaphragm elements 122 each have a separately contactable outer electrode 124. In the exemplary embodiment of FIG. 1, the diaphragm elements

122 optionally each have two outer electrodes 124, a first outer electrode 125 and a second outer electrode 126, which are electrically insulated from one another by an insulating element 127. In this case, the first outer electrode 125 surrounds the second outer electrode 126. The first outer electrodes 125 are thus arranged at an edge region 112 of the substrate 110, while the second outer electrodes 126 are arranged in a central region 113 of the through-cavity 111. The diaphragm elements 122 together with the middle support layer 121 form one or more cavities 128 on both sides of the middle support layer at least in regions. The microelectromechanical transducer 120 spans the through-cavity 111 at least partially, completely in the exemplary embodiment of FIG. 1, and is deformable along a vertical movement direction 103. The vertical movement direction 103 can be perpendicular to a main extension plane 129 of the microelectromechanical transducer 120. The microelectromechanical transducer 120 has a bending region 130. In the exemplary embodiment of FIG. 1, a plurality of bending regions is provided, a first bending region 131 in the region of the first outer electrodes 124 and a second bending region 132 in the region of the second outer electrodes 125. A deformation of the microelectromechanical transducer 120 in the vertical movement direction 103 results in a bending of the bending region 130. Spacers 133 are arranged between the middle support layer 121 and the diaphragm elements 120. At least one of the spacers 133 is arranged in the bending region 130. In the exemplary embodiment of FIG. 1, a plurality of spacers 133 is arranged in the bending regions 131, 132. The spacers 133 can be designed to be flat.

Figure 2:
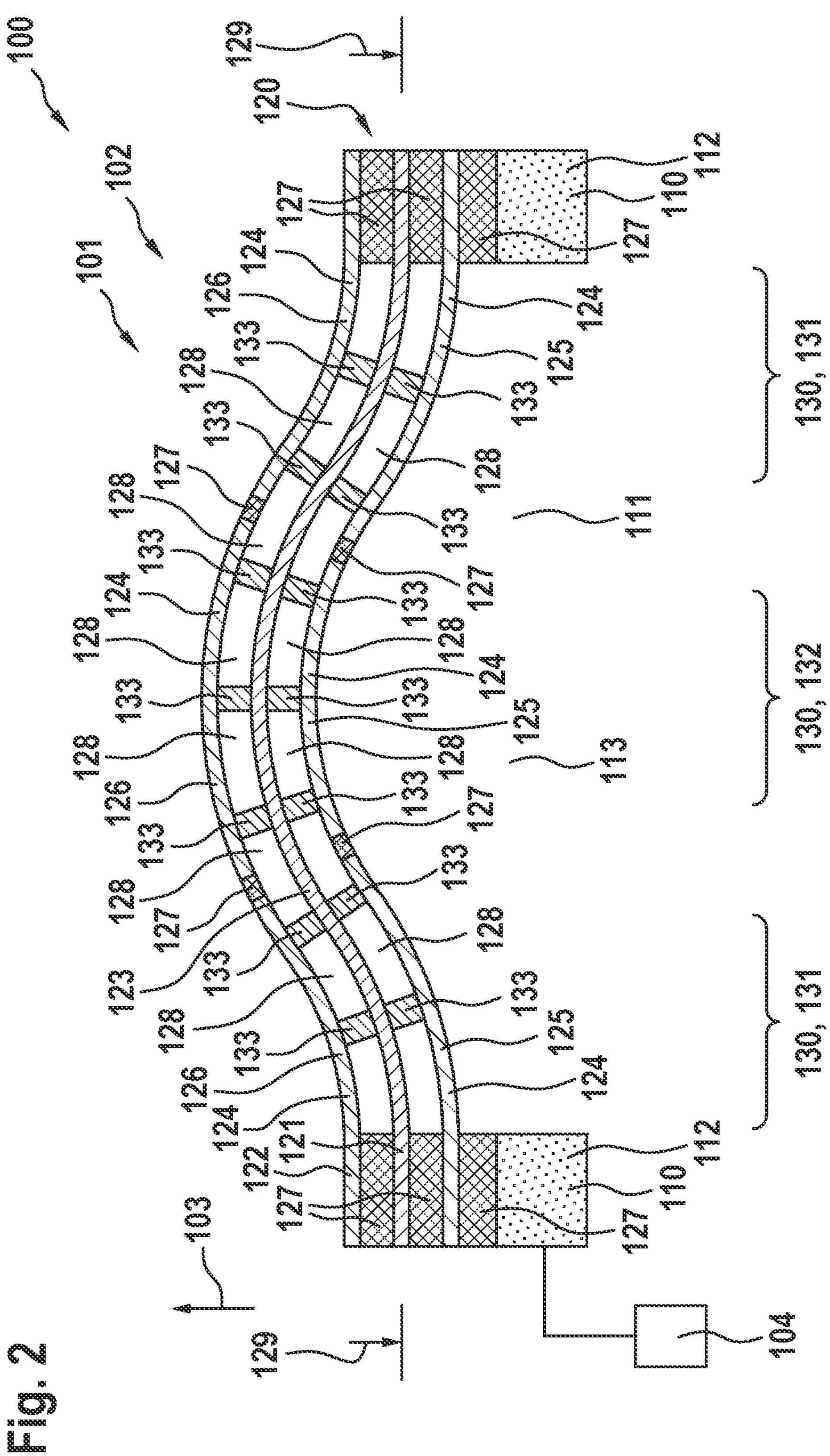
FIG. 2 is a further cross-section of the microelectromechanical component of FIG. 1, according to an example embodiment of the present invention.

FIG. 2 is a further cross-section of the microelectromechanical component 100 of FIG. 1, in which the microelectromechanical transducer 120 is deformed in the vertical movement direction. This may, for example, have taken place due to an interaction with a pressure gradient of a fluid, for example after a sound impinges on the microelectromechanical component 100. In this case, the microelectromechanical transducer 120 is deflected upward in the representation of FIG. 2. As a result, the first outer electrode 125 is shortened in the first bending region 131, whereas the second outer electrode 126 is shortened in the second bending region 132. This results in a change in capacitance between the first outer electrode 125 and the center electrode 123 and a change in capacitance between the second outer electrode 126 and the center electrode 123, which can be tapped as an acoustic signal. A bending of the bending region 130 or of the bending regions 131, 132 results in a change in a capacitance between the center electrode 123 and the outer electrodes 124. In particular, the center electrode 123 and in each case one of the outer electrodes 124 can be regarded as a capacitance. When the bending region 130 is bent, a distance between the center electrode 123 and the outer electrodes 124 changes so that the capacitance changes. This change in capacitance can be read. A bending of the bending region 130 can in particular take place by a sound impinging on the microelectromechanical component. In this case, the microelectromechanical component 100 acts as a microphone 102.

It can be provided that the spacers 133 are fixedly connected to the center electrode 123 or the outer electrodes 124. In particular, the center electrode 123 or the outer electrodes 124 are not movable relative to the spacers 133. This in particular also ensures that the center electrode 123 likewise bends in the bending region 130, and a signal evaluation is thus simplified since a change in capacitance in the bending region 130 is greater than a change in capacitance in the components from the related art, in which the outer electrodes can move relative to the center electrode. Furthermore, the diaphragm element 122 is optionally designed in such a way that it spans the entire through-cavity 111.

The cavity 128 or the cavities 128 can have a fluidic connection to the outside. In particular, it can be provided that a connection to the outside is provided for at least one cavity 128, a plurality of cavities 128, or for all cavities 128. The connection can extend both via through-openings in the outer electrodes 124 and via through-openings in the spacers 133 and the outer electrodes 124 or the substrate 110.

Such a microelectromechanical component 100 can be produced with the conventional methods for microelectromechanical systems.

In FIGS. 1 and 2, it is also optionally shown that insulating elements 127, which electrically insulate the outer electrodes 124 from the center electrode 123 and from the substrate 110, are also arranged in the region of the substrate 110. Also shown is an optional electronic circuit 104, which can be used to read the capacitances, as already described above, and to convert them into an acoustic signal. Furthermore, it can be provided that the diaphragm element 122 and/or the middle support layer 121 have an insulation layer (not shown in FIGS. 1 and 2). The insulation layer can in particular be thin in comparison to the outer electrodes 124 or the center electrode. This can make reading the capacitance between the outer electrode 124 and the center electrode 123 possible even if the diaphragm element 122 and the middle support layer 121 touch.

In an exemplary embodiment of the microelectromechanical component 100, the spacers 133 between the diaphragm elements 122 and the middle support layer 121 are designed to be wall-shaped and/or column-shaped. This makes simple production of the spacers 133 with the conventional methods for microelectromechanical systems possible.

Figure 3:
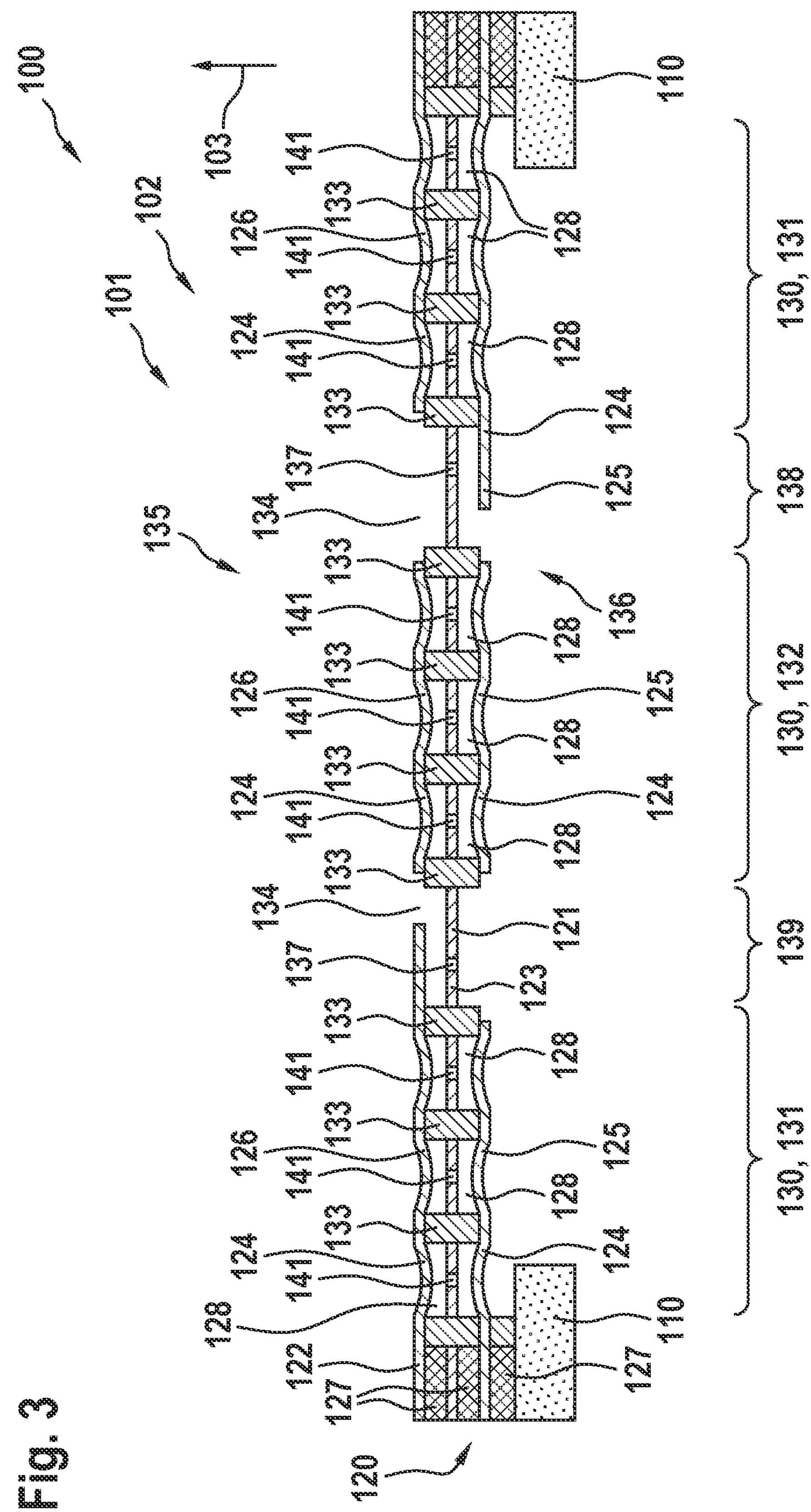
FIG. 3 is a cross-section of a further microelectromechanical component, according to an example embodiment of the present invention.

FIG. 3 is a cross-section of a further microelectromechanical component 100, which corresponds to the microelectromechanical component 100 of FIGS. 1 and 2, except where differences are described below. Here, the diaphragm elements 122 do not have any insulating elements 127 in order to insulate the first outer electrode 125 from the second outer electrode 126. Instead, the diaphragm element 122 is interrupted by connection openings 134 so that the electrical separation of the first outer electrode 125 and second outer electrode 126 results.

In an exemplary embodiment of the microelectromechanical component 100 optionally shown in FIG. 3, the microelectromechanical transducer 120 has at least one fluidic connection opening 134. In FIG. 3, in particular, a plurality of fluidic connection openings 134 are optionally shown. A connection between a front side 135 of the microelectromechanical transducer 120 and a rear side 136 of the microelectromechanical transducer 120 is provided by means of the fluidic connection opening 134 or the fluid connection openings 134. The fluidic connection opening 134 can in particular be used for a pressure compensation between the front side 135 of the microelectromechanical transducer 120 and the rear side 136 of the microelectromechanical transducer 120 and thus can help to prevent or at least reduce damage to the microelectromechanical transducer 120 in the case of an overpressure on either the front side 135 of the microelectromechanical transducer 120 or the rear side 136 of the microelectromechanical transducer 120. For this purpose, the middle support layer 121 in particular has a through-opening 137. This through-opening is covered by one of the diaphragm elements 122 in each case. As a result, an overpressure coming from the front side 135 can be compensated in a first overload region 138, in which the lower diaphragm element 122, i.e., the diaphragm element facing the substrate 110, covers the through-opening 137. An overpressure coming from the rear side 136 can be compensated in a second overload region 139, in which the upper diaphragm element 122, i.e., the diaphragm element facing away from the substrate 110, covers the through-opening 137.

In an exemplary embodiment of the microelectromechanical component 100 optionally shown in FIG. 3, the cavity 128 has or the cavities 128 have a negative pressure, in particular a vacuum. In this case, a connection opening 141 can be provided in the middle support layer 121 and/or the center electrode 123 in order to fluidically connect cavities 128 on both sides to one another. This can result in the deflection of the diaphragm elements 122 shown in FIG. 3. Due to a differential pressure between the cavity 128 and the surroundings, diaphragm elements 122 can be deflected to such an extent that the diaphragm elements 122 rest mechanically between two adjacent spacers 133 on the middle support layer 121. This can increase a sensitivity. In particular, it can be provided that the diaphragm element 122 and/or the middle support layer 121 have an insulation layer so that no short-circuit is produced by the mechanical contact.

Figure 4:
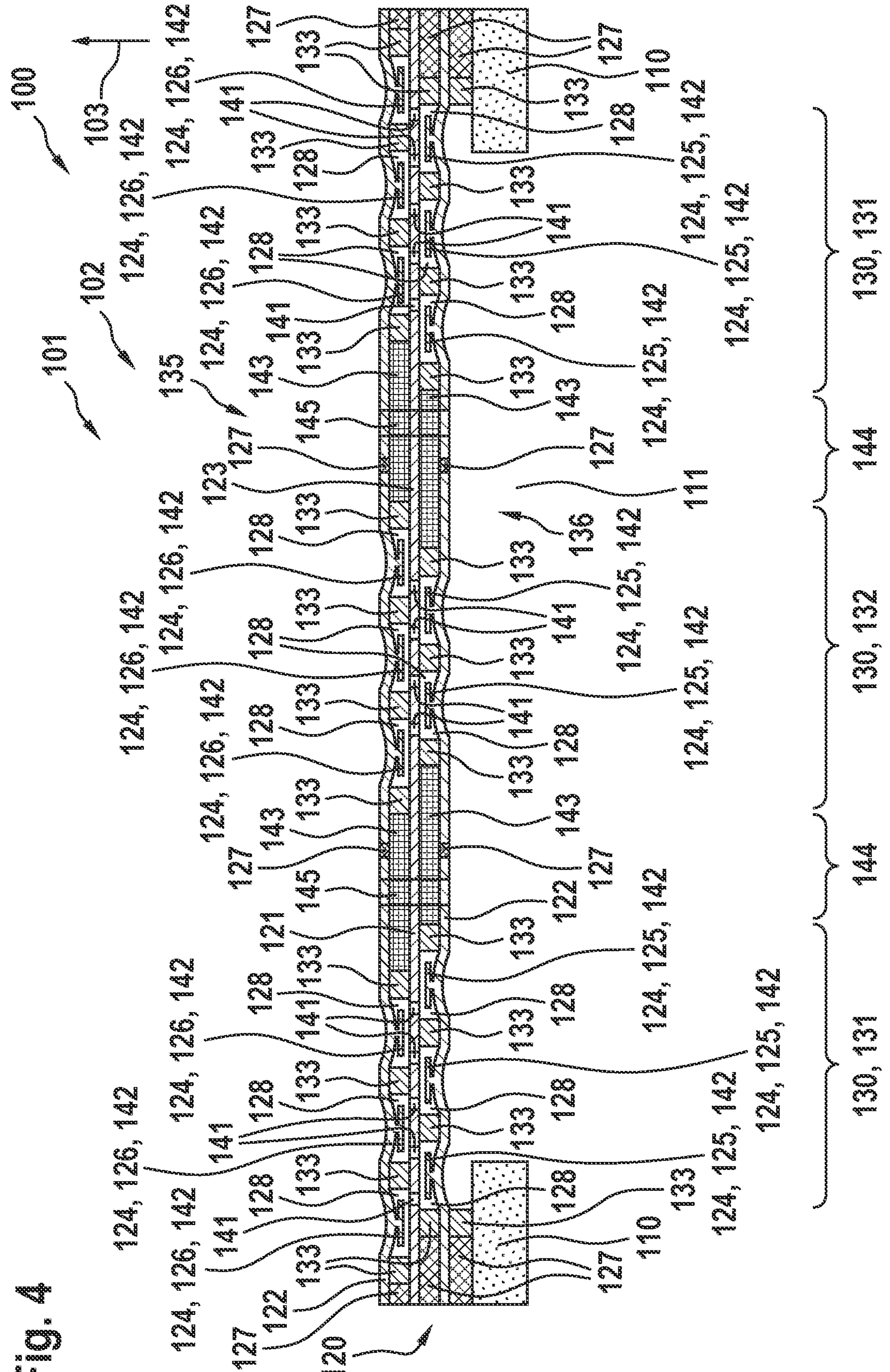
FIG. 4 is a cross-section of a further microelectromechanical component, according to an example embodiment of the present invention.

FIG. 4 is a cross-section of a further microelectromechanical component 100, which corresponds to the microelectromechanical component 100 of FIGS. 1 and 2, except where differences are described below. The spacers 133 are arranged offset to one another on both sides of the middle support layer 121.

In an exemplary embodiment of the microelectromechanical component 100 optionally shown in FIG. 4, the outer electrodes 124 are shown as plates 142 offset from the diaphragm elements 122. As a result, the outer electrodes 124 can be arranged closer to the center electrode 123 and can have a flatness so that a sensitivity and a linearity of the measurement signal can be increased.

Furthermore, in FIG. 4, optional stiffening elements 143 are provided between the middle support layer 121 and the diaphragm elements 122, with which stiffening elements a stiffening region 144 of the microelectromechanical transducer 120 can be formed. A bending of the microelectromechanical transducer 120 can thus be focused onto the bending regions 131, 132, as a result of which a sensitivity can likewise be increased.

Also optionally shown in FIG. 4 are pressure compensation holes 145, which, like the through-openings 137 of the embodiment of FIG. 3, can be used for a pressure compensation between the front side 135 and the rear side 136. These pressure compensation holes can in particular be provided in the stiffening region 144.

The features described for the various configurations of FIG. 3 can also be used in the various configurations of FIG. 4.

Figure 5:
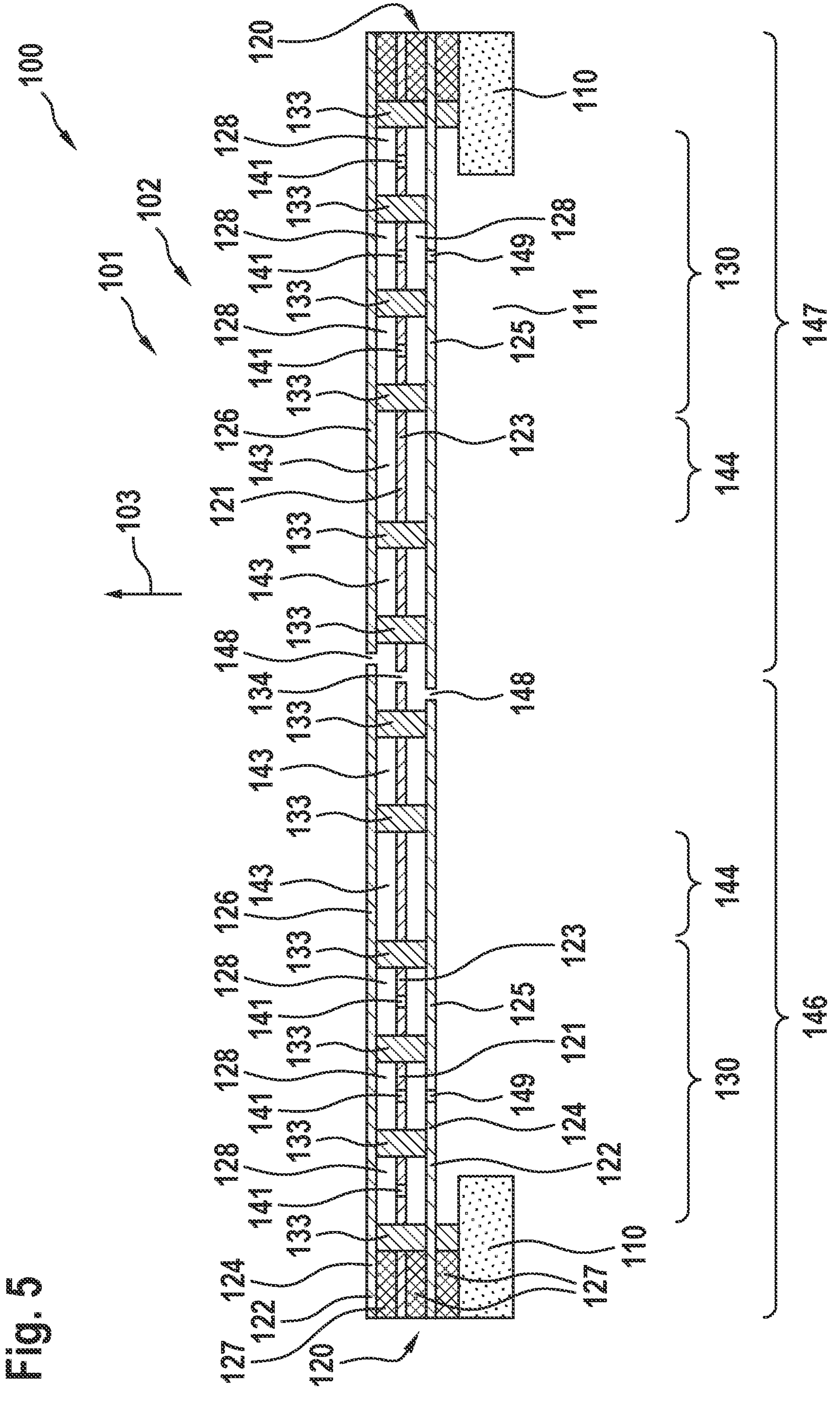
FIG. 5 is a cross-section of a further microelectromechanical component, according to an example embodiment of the present invention.

FIG. 5 shows a cross-section of a further microelectromechanical component 100, which corresponds to the microelectromechanical component 100 of FIGS. 1 and 2, except where differences are described below. The microelectromechanical component 100 has a plurality of microelectromechanical transducers 120, in this case a first microelectromechanical transducer 146 and a second microelectromechanical transducer 147. The microelectromechanical transducers 120, 146, 147 each consist of a middle support layer 121 and two diaphragm elements 122 spaced apart from the middle support layer 121. The middle support layer 121 has at least one center electrode 123. The diaphragm elements 122 of each microelectromechanical transducer 120, 146, 147 each have a separately contactable outer electrode 124. The diaphragm elements 122 together with the middle support layer 121 form a cavity 128 or a plurality of cavities 128 on both sides of the middle support layer 121 at least in regions. The microelectromechanical transducers 120, 146, 147 span the through-cavity 111 at least partially and are deformable along a vertical movement direction 103. The microelectromechanical transducers 120, 146, 147 each have a bending region 130. A deformation of the microelectromechanical transducers 120, 146, 147 in the vertical movement direction 103 in each case results in a bending of the bending region 130 of the relevant microelectromechanical transducer 120, 146, 147. Spacers 133 are arranged between the middle support layer 121 and the diaphragm elements 122. At least one of the spacers 133 is arranged in each bending region 130. A number of the microelectromechanical transducers 120, 146, 147 may be two, three, or four. However, even more microelectromechanical transducers 120, 146, 147 may be provided. Centrally, the middle support layer 121 is interrupted and has a fluidic connection opening 134.

Figure 6:
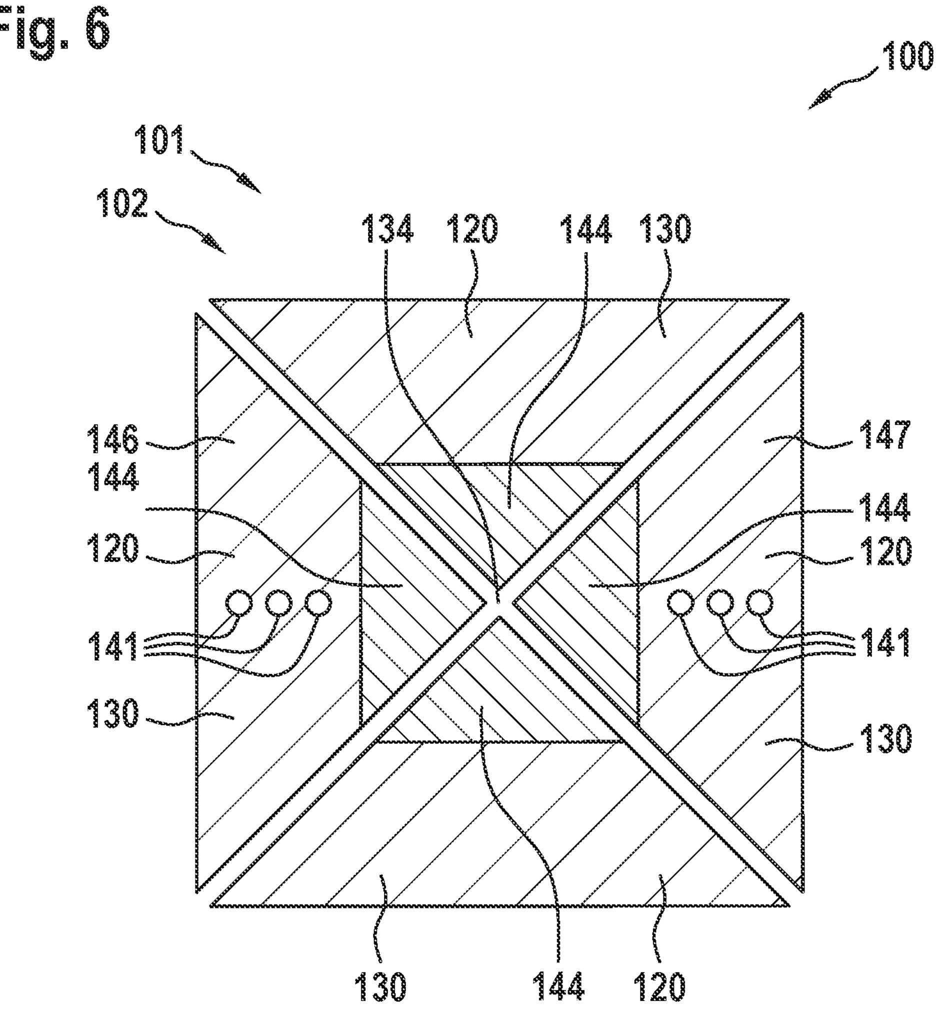
FIG. 6 is a further cross-section of the microelectromechanical component of FIG. 5, according to an example embodiment of the present invention.

FIG. 6 is a further cross-section of the microelectromechanical component 100 of FIG. 5 at the height of the middle support layer 121. The microelectromechanical transducers 120 are designed as cantilever elements, which are each fastened individually to the substrate 110. The fluidic connection opening 134 is arranged substantially in the shape of a cross between the microelectromechanical transducers 120. In this case, it can be provided that the diaphragm elements 122 of the microelectromechanical transducers 120 are designed in such a way that the fluidic connection opening 134 of the middle support layer 121 is substantially covered by the diaphragm elements 122 and, as shown in FIG. 5, a relevant opening 148 between the diaphragm elements 122 is arranged offset to the fluidic connection opening 134. It can be provided that the microelectromechanical transducers 120 have a mechanical coupling among one another, for example via connecting webs between the microelectromechanical transducers 120.

FIG. 5 optionally shows that the diaphragm elements 122 have a pressure compensation opening 149 so that the cavities 128 are connected to the surroundings. Furthermore, connection openings 141, which have the function described above, are provided in the middle support layer 121. This configuration can also be provided in the exemplary embodiments which are explained in connection with FIGS. 3 and 4. Furthermore, in the exemplary embodiment of FIGS. 5 and 6, the negative pressure (up to the vacuum) explained in connection with FIG. 3 can also be provided in the cavities 128.

FIGS. 5 and 6 optionally show that the microelectromechanical transducers 120 also each have a stiffening region 144, formed analogously to the configuration of FIG. 4, with stiffening elements 143.

In all exemplary embodiments of the microelectromechanical component 100, the bending region 130, 131, 132 of the microelectromechanical transducer 120 can be arranged in regions of greatest curvature of the microelectromechanical transducer 120. A bending region 130, 131, 132 of the microelectromechanical transducer 120 may, for example, be arranged centrally and/or in a suspension region of the middle support layer 121.

In an exemplary embodiment, the microelectromechanical component 100 furthermore comprises an electronic circuit 104, which can be designed as explained in connection with FIGS. 1 and 2. Such an electronic circuit 104 can thus in particular also be provided in the exemplary embodiments of FIGS. 3 to 6. The electronic circuit 104 may furthermore be configured to apply an electrical bias voltage between the center electrode 123 and the outer electrodes 124. The bias voltage can in particular be used to adjust a bending of the electromechanical transducer 120 and thus to increase a sensitivity. For all exemplary embodiments, the electronic circuit 104 can be part of the substrate 104, so that an integrated circuit is present. Furthermore, the electronic circuit 104 can be accommodated in a separate component of the microelectromechanical component 100.

The fluidic connection openings 134 or pressure compensation holes 145 explained in connection with FIGS. 3 to 6 can act as valves seated on both sides of the middle support layer and can in particular be arranged in a region of small curvature of the microelectromechanical transducer 120. In particular, the fluidic connection openings 134 or the pressure compensation holes 145 can ensure overload resistance and static pressure compensation.

In all configurations, the center electrode 123 can be embedded in an insulating layer of the middle support layer 121. Alternatively or additionally, the outer electrodes 124 can be embedded in an insulating layer of the diaphragm elements 122.

The cavities 128 can be closed via a laser reseal hole, preferably in the region of the substrate 110 and in particular outside the through-cavity 111.

The outer electrodes 124 can be anchored to the diaphragm elements 122.

Figure 7:
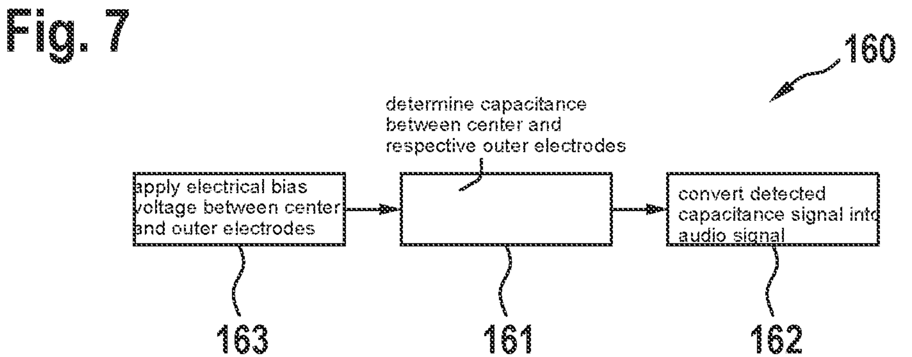
FIG. 7 is a flowchart of an operating method for a microelectromechanical component, according to an example embodiment of the present invention.

FIG. 7 is a flowchart 160 of a method relating to the present invention for operating a microelectromechanical component 100, which can correspond to one of the configurations of the microelectromechanical component 100 explained in connection with FIGS. 1 to 6. In this method, a capacitance between the center electrode 123 and the respective outer electrodes 124 is determined in a first method step in order to detect a bending of the bending region 130 and thus a deformation of the microelectromechanical transducer 120 in the vertical movement direction 103. In particular, a capacitance between the center electrode 123 and one of the outer electrodes 124 and also a further capacitance between the center electrode 123 and the other outer electrode 124 can be detected. In a second method step 162, which can be performed after the first method step 161, the detected capacitance signal can, for example, be converted into an audio signal so that the microelectromechanical component 100 operates as a microphone 102.

In an embodiment of the method, an electrical bias voltage is furthermore applied between the center electrode 123 and the outer electrodes 124 in a third method step 163 performed before the first method step 161. The bias voltage can in particular be used to adjust a bending of the electromechanical transducer 120 and thus to increase a sensitivity.

Although the present invention has been described in detail by the preferred exemplary embodiments, the present invention is not limited to the disclosed examples and other variations may be derived therefrom by a person skilled in the art without departing from the scope of protection of the present invention.

What is claimed is:

1. A microelectromechanical component for interacting with a pressure gradient of a fluid, comprising:

a substrate having a through-cavity;

at least one microelectromechanical transducer including a middle support layer; and two diaphragm elements spaced apart from the middle support layer;

wherein the middle support layer has at least one center electrode, wherein the diaphragm elements each have a separately contactable outer electrode, wherein the diaphragm elements together with the middle support layer form a cavity or a plurality of cavities on both sides of the middle support layer at least in regions, wherein the microelectromechanical transducer spans the through-cavity at least partially and is deformable along a vertical movement direction, wherein the microelectromechanical transducer has a bending region, wherein a deformation of the microelectromechanical transducer in a vertical movement direction results in a bending of the bending region, wherein spacers are arranged between the middle support layer and the diaphragm elements, and wherein at least one of the spacers is arranged in the bending region.

2. A microelectromechanical component for interacting with a pressure gradient of a fluid, comprising:

a substrate having a through-cavity;

at least one microelectromechanical transducer including a middle support layer; and two diaphragm elements spaced apart from the middle support layer;

wherein the middle support layer has at least one center electrode, wherein the diaphragm elements each have a separately contactable outer electrode, wherein the diaphragm elements together with the middle support layer form a cavity or a plurality of cavities on both sides of the middle support layer at least in regions, wherein the microelectromechanical transducer spans the through-cavity at least partially and is deformable along a vertical movement direction, wherein the microelectromechanical transducer has a bending region, wherein a deformation of the microelectromechanical transducer in a vertical movement direction results in a bending of the bending region, wherein spacers are arranged between the middle support layer and the diaphragm elements, and wherein at least one of the spacers is arranged in the bending region, wherein the microelectromechanical component includes a plurality of microelectromechanical transducers, each including a respective middle support layer and two respective diaphragm elements spaced apart from the respective middle support layer, wherein the respective middle support layer has at least one center electrode, wherein the respective diaphragm elements of each of the microelectromechanical transducers each have a separately contactable outer electrode, wherein the respective diaphragm elements together with the respective middle support layer form a respective cavity or a respective plurality of cavities on both sides of the respective middle support layer at least in regions, wherein the microelectromechanical transducers span the through-cavity at least partially and are deformable along a vertical movement direction, wherein the microelectromechanical transducers each have a respective bending region, wherein a deformation of the microelectromechanical transducers in the vertical movement direction in each case results in a bending of the respective bending region of the relevant microelectromechanical transducer, wherein respective spacers are arranged between the respective middle support layer and the respective diaphragm elements, wherein at least one of the respective spacers is arranged in each respective bending region.

3. The microelectromechanical component according to claim 1, wherein bending region of the microelectromechanical transducer are arranged in regions of greatest curvature of the microelectromechanical transducer.

4. The microelectromechanical component according to claim 1, wherein the microelectromechanical transducer has at least one fluidic connection opening, wherein a connection between a front side of the microelectromechanical transducer and a rear side of the microelectromechanical transducer is provided by the fluidic connection opening.

5. The microelectromechanical component according to claim 1, wherein the cavity or cavities have a negative pressure including a vacuum.

6. The microelectromechanical component according to claim 1, wherein the spacers between the diaphragm elements and the middle support layer are wall-shaped and/or column-shaped.

7. The microelectromechanical component according to claim 1, wherein the spacers are arranged offset to one another on both sides of the middle support layer.

8. The microelectromechanical component according to claim 1, further comprising an electronic circuit, wherein the electronic circuit is configured to apply an electrical bias voltage between the center electrode and the outer electrodes.

9. A method for operating a microelectromechanical component, the micromechanical component including:

a substrate having a through-cavity;

at least one microelectromechanical transducer including a middle support layer; and two diaphragm elements spaced apart from the middle support layer;

wherein the middle support layer has at least one center electrode, wherein the diaphragm elements each have a separately contactable outer electrode, wherein the diaphragm elements together with the middle support layer form a cavity or a plurality of cavities on both sides of the middle support layer at least in regions, wherein the microelectromechanical transducer spans the through-cavity at least partially and is deformable along a vertical movement direction, wherein the microelectromechanical transducer has a bending region, wherein a deformation of the microelectromechanical transducer in a vertical movement direction results in a bending of the bending region, wherein spacers are arranged between the middle support layer and the diaphragm elements, and wherein at least one of the spacers is arranged in the bending region;

wherein the method comprises:

determining a capacitance between the center electrode and the respective outer electrodes to detect a bending of the bending region and thus a deformation of the microelectromechanical transducer in the vertical movement direction.

10. The method according to claim 9, further comprising: applying a bias voltage between the center electrode and the outer electrodes.

* * * * *